United States Patent

Bernier et al.

[11] Patent Number: 5,808,326
[45] Date of Patent: Sep. 15, 1998

[54] DELTA PROTECTION COMPONENT

[75] Inventors: Eric Bernier; Christian Ballon, both of Tours, France

[73] Assignee: SGS-Thomson Microelectronics S.A., Saint Genis, France

[21] Appl. No.: 843,732

[22] Filed: Apr. 21, 1997

Related U.S. Application Data

[63] Continuation of Ser. No. 345,522, Nov. 28, 1994, abandoned.

[30] Foreign Application Priority Data

Nov. 29, 1993 [FR] France .................................. 93 14553

[51] Int. Cl.⁶ ........................... H01L 29/74; H01L 31/111
[52] U.S. Cl. ........................... 257/109; 257/155; 257/175
[58] Field of Search ........................ 257/109, 111, 257/119, 121, 126, 128, 130, 155, 173, 175

[56] References Cited

U.S. PATENT DOCUMENTS

| | | | |
|---|---|---|---|
| 4,282,555 | 8/1981 | Svedberg | 361/56 |
| 4,331,884 | 5/1982 | Svedberg | 307/252 |
| 4,905,119 | 2/1990 | Webb | 361/119 |
| 5,150,271 | 9/1992 | Unterweger et al. | 361/119 |
| 5,281,832 | 1/1994 | Clark et al. | 257/107 |
| 5,401,984 | 3/1995 | Byah et al. | 257/107 |

FOREIGN PATENT DOCUMENTS

| | | | |
|---|---|---|---|
| A-2184884 | 7/1987 | United Kingdom | H01L 29/74 |
| WO-A-8706768 | 11/1987 | WIPO | H01L 29/74 |

*Primary Examiner*—Ngân V. Ngô
*Attorney, Agent, or Firm*—Wolf, Greenfield & Sacks, P.C.; James H. Morris

[57] ABSTRACT

A protection semiconductor component includes at least two pairs of main Shockley diodes, each pair including two parallel diodes, head-to-tail connected between a front surface metallization and a rear surface metallization, the rear surface metallization being common to the two pairs of diodes. Each of the main diodes whose blocking junction corresponds to a distinct well on the side of the front surface is associated with at least one auxiliary Shockley diode having the same polarity and a lower triggering threshold, the triggering of one auxiliary diode thus causing the triggering of the other auxiliary diode and of the associated main Shockley diodes.

19 Claims, 5 Drawing Sheets

DELTA PROTECTION COMPONENT

This application is a continuation of application Ser. No. 08/345,522, filed Nov. 28, 1994, now abandoned.

BACKGROUND OF THE INVENTION

1. Field of the Invention

The present invention relates to overvoltage protection components to be connected between two lines to be protected and ground, and more particularly relates to such a component constituting a bidirectional Shockley diode between each of the lines and between each line and ground according to a delta configuration. Such components are, for example, designed to protect telephone lines against overvoltages caused by lightning or by accidental contact with a high voltage line.

European patent application 0,600,810 relates to a monolithic component of this type and is more particularly designed to solve the problem caused by the switching off of the component after an overvoltage, taking into account that the two wires of a telephone line are generally biased at voltages of −48 volts and −2 volts.

2. Discussion of the Related Art

FIGS. 1A, 1B and 1C represent the structure of such a component. FIG. 1A is a top view, FIG. 1B is an upside-down bottom view, and FIG. 1C is a cross-sectional view along line CC of FIGS. 1A and 1B. This component is fabricated from an N-type silicon substrate 1 having a very low doping level (N⁻). Two P-type wells 2 and 3 are diffused in the upper surface of the substrate. An N-type region 4 is diffused inside well 2, and an N-type region 5 is diffused inside well 3. Regions 4 and 5 occupy substantially one half of the surface of the wells 2 and 3. A P-type region 6 is diffused in substantially the whole rear surface of the component. In region 6, an N-type region 7 is diffused and occupies substantially a surface complementing the surface of regions 4 and 5, in a projection perpendicular to the plane of the surface of the main component.

A metallization M1 coats the upper surface of well 2 and of region 4 formed therein. A metallization M2 coats well 3 and region 5 formed therein. A metallization M3 coats the rear surface of the component.

In addition, as disclosed in the above cited patent application, regions 4, 5 and 7 are provided with emitter shorts (not shown), that is, these regions are locally interrupted so that underlying well portions appear at the surface. The above patent application also discloses the way in which the densities of the emitter shorts are optimized.

FIG. 2 represents an equivalent circuit of the component of FIGS. 1A–1C. This component is equivalent to the association of six structures including four layers having alternate conductivity types, usually referred to as Shockley diodes or gateless thyristors.

A first Shockley diode S1 is formed between metallizations M1 and M3, with its anode on the side of metallization M1. Diode S1 successively includes the N-type region 4, the P-type well 2, the N-type substrate 1, and the P-type region 6.

A second parallel Shockley diode S2, head-to-tail connected to the Shockley diode S1, is also formed between metallizations M1 and M3. The Shockley diode S2 successively includes well 2, substrate 1, well 6, and region 7.

A third Shockley diode S3 is formed between metallizations M2 and M3, with its anode on the side of metallization M3, and successively includes region 5, well 3, substrate 1, and well 6.

A fourth parallel Shockley diode S4, head-to-tail connected to the Shockley diode S3, successively includes well 3, substrate 1, well 6, and region 7.

A lateral Shockley diode S5 is formed between metallizations M1 and M2 and successively includes region 4, well 2, substrate 1, and well 3.

A parallel Shockley diode S6, head-to-tail connected to the Shockley diode S5 is also a lateral Shockley diode and successively includes well 2, substrate 1, well 3, and region 5.

FIG. 3 represents the same equivalent circuit as the one shown in FIG. 2 but in which the pairs of parallel, head-to-tail connected Shockley diodes S1–S2, S3–S4, and S5–S6, are illustrated as bidirectional Shockley diodes DS1, DS2, and DS3, respectively.

FIG. 4 represents the current-voltage curve of a conventional bidirectional Shockley diode. As long as the voltage across the bidirectional Shockley diode is lower than an avalanche or breakdown voltage VBR, the diode is blocked, that is, the current across the Shockley diode is practically zero. As soon as the voltage across the Shockley diode is higher than VBR, the current rapidly increases, whereas the voltage slowly increases. When the voltage across the Shockley diode reaches a so-called breakover voltage value VBO, the voltage across the Shockley diode rapidly drops and the current is established as a function of the circuit's characteristics. The device is blocked again when the current across its terminals becomes lower than a hold current IH. This characteristic is substantially symmetrical with respect to the origin, provided that the components, whose symmetry may be affected by the differences in the doping of some of their layers or by a difference in the density of their shorting holes, are effectively symmetrically disposed. In an application to the protection of telephone lines, the hold current must be relatively high (200–400 mA) to allow the component to be blocked again at the end of an overvoltage. This requires a rather high density of shorting holes and, as a consequence, a relatively large difference between the values of the avalanche voltage VBR and the breakover voltage VBO.

The component described in the above cited application, whose structure and operation have been disclosed above, satisfies the main desired functions. However, for telephone networks for which these components are designed, increasingly drastic protection standards are defined. According to one of these standards, in case an overvoltage with respect to ground simultaneously occurs on the two wires of the telephone line, the bidirectional Shockley diodes DS1 and DS2 must have the same breakover voltage. More particularly, according to standards, the devices must successfully satisfy a test defined by the circuit of FIG. 5, where the protection component is referenced 10. The terminals M1 and M2 of component 10 are connected to the same terminal 11 of an a.c. supply source 12 through respective identical resistors R1 and R2. The ground terminal 13 of the a.c. supply source 12, for example a ±500-volt source, is connected to terminal M3 of component 10. Moreover, a resistor R3 is connected between terminals M1 and M2. Standards define voltage surge limits across resistor R3. These limits in fact impose a simultaneous triggering of the two bidirectional Shockley diodes DS1 and DS2, if a simultaneous overvoltage occurs on both diodes.

When a positive overvoltage occurs on metallizations M1 and M2, the two Shockley diodes S2 and S4 are active. The blocking junction of the two Shockley diodes S2 and S4 corresponds to the junction between the lower well 6 and substrate 1. Since it is a non-interrupted junction, as soon as the avalanche occurs in one point of the junction, the whole junction becomes conductive and the two Shockley diodes S2 and S4 become practically simultaneously conductive.

In contrast, if a negative overvoltage simultaneously occurs on metallizations M1 and M2, the two Shockley diodes S1 and S3 are active. The blocking junctions of the Shockley diodes are the junction between well 2 and substrate 1 and the junction between well 3 and substrate 1, respectively. Theoretically, these junctions are identical and should normally simultaneously break down. But, in practice, although these junctions have substantially the same avalanche voltage VBR, they have not the same breakover voltage value VBO, more particularly, as indicated above, if VBO is much higher than VBR. Thus, to comply with the test previously defined with reference to FIG. 5, a large proportion of fabricated components is discarded, which in fact constitutes a sorting operation resulting in a significant waste of components.

SUMMARY OF THE INVENTION

An object of the present invention is to avoid this drawback and to provide a protection component in which the bidirectional Shockley diodes connected between each of the lines to be protected and ground have a simultaneous or practically simultaneous triggering, independent of the voltage polarity across the bidirectional Shockley diodes.

To achieve these objects, the present invention provides a protection semiconductor component including at least two pairs of main Shockley diodes. Each pair of Shockley diode includes two parallel diodes, head-to-tail connected between a front surface metallization and a rear surface metallization, the rear surface metallization being common to the two pairs of diodes. Each diode, whose blocking junction corresponds to a distinct well on the side of the front surface, is associated with at least one auxiliary diode having the same polarity and a lower triggering threshold, the triggering of one auxiliary diode thus causing the triggering of the other auxiliary Shockley diode and of the associated main Shockley diodes.

In other words, the present invention provides an overvoltage protection semiconductor component, including a semiconductor substrate or first region of a first conductivity type having an upper surface and a lower surface; second and third regions of the second conductivity type, on the upper surface, each region occupying substantially one half of the surface of the component; fourth and fifth regions of the first conductivity type, including shorting holes, in each of the second and third regions, each occupying substantially one half of the surface of the second or third region; a sixth region, on the lower surface, occupying substantially the whole surface of the component; a seventh region of the first conductivity type, that is provided with shorting holes and formed in the sixth region and that substantially complements, in projection, the third and fourth regions; a first contact connected to the second and fourth regions; a second contact connected to the third and fifth regions; a third contact connected to the sixth and seventh regions; whereby first and second parallel, head-to-tail, Shockley diodes are formed between the second and third contacts, and third and fourth parallel, head-to-tail, Shockley diodes are formed between the second and third contacts, the first Shockley diode corresponding to the fourth, second, first and sixth regions, the third Shockley diode corresponding to the fifth, third, first and sixth regions. According to the invention, a preferential triggering structure of the first and third Shockley diodes is provided.

According to an embodiment of the present invention, the preferential triggering structure includes an eighth region of the second conductivity type adjacent to the first and third regions, and ninth and tenth regions of the first conductivity type, without shorting holes, that are disposed in the eighth region, the ninth and tenth regions being connected to the second and third regions, respectively.

According to an embodiment of the present invention, eleventh regions of the second conductivity type are formed in the upper surface of the substrate and twelfth regions of the first conductivity type are formed in the eleventh regions, the connection between each ninth and tenth regions and between the second and third regions is made through intermediate contacts connecting each of the ninth, tenth and twelfth regions to the eleventh adjacent region.

According to an embodiment of the present invention, a thirteenth region of the first conductivity type, more highly doped than the substrate, is disposed at the interface between the eighth region and the substrate.

According to an embodiment of the present invention, the eighth region is partitioned into two sub-regions, having a lower doping level than the second and third regions, separated by a region of the second conductivity type, and more highly doped than the second and third regions.

According to an embodiment of the present invention, the eighth region is partitioned into two sub-regions, having a lower doping level than the second and third regions, separated by a region of the first conductivity type, more highly doped than the substrate.

According to an embodiment of the present invention, the eighth region is partitioned into two sub-regions, having a lower doping level than the second and third regions, whose facing regions include a region of the second conductivity type, having the same doping level as the second and third regions.

According to an embodiment of the present invention, the sixth region includes, facing the preferential triggering region, a deeper region having a higher doping level.

According to an embodiment of the present invention, ninth and tenth regions are disposed in regions facing the second and third regions; and preferential triggering is provided by fourteenth regions of the first type of conductivity, having a higher doping level than the substrate, these fourteenth regions being disposed at the interface between the first and second regions and the substrate, beneath the ninth and tenth regions.

The foregoing and other objects, features, aspects and advantages of the invention will become apparent from the following detailed description of the present invention when taken in conjunction with the accompanying drawings.

As conventional in integrated circuit representation, it will be noted that the various drawings are not drawn to scale, either for one figure or from one figure to another, and in particular the thicknesses of the various layers are arbitrarily drawn in order to facilitate legibility of the drawings.

DETAILED DESCRIPTION

Figure 1A:
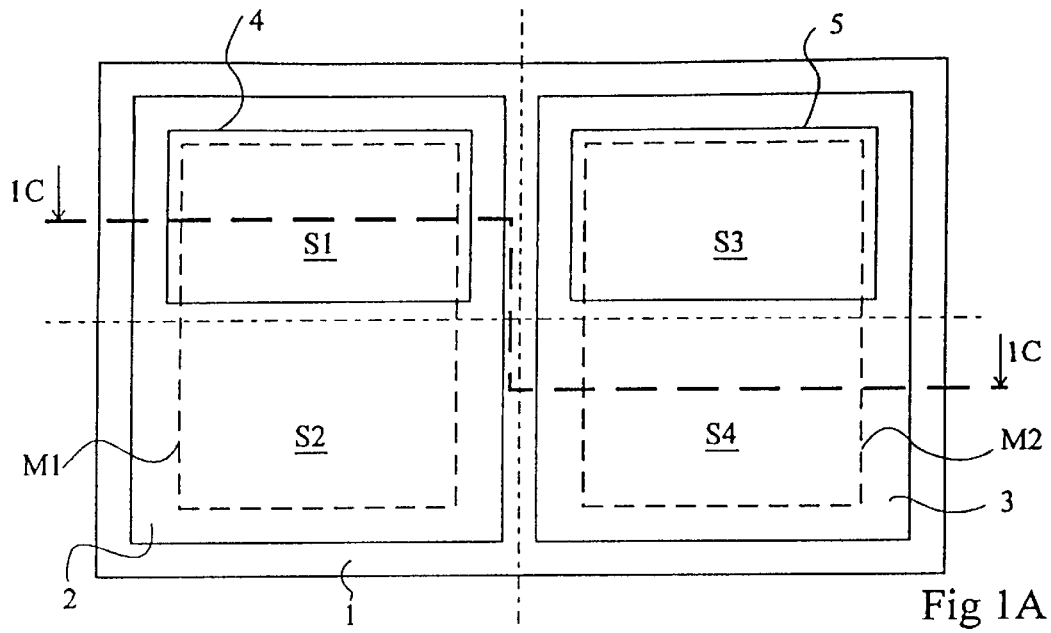
FIGS. 1A, 1B, and 1C are a top view, an upside-down bottom view, and a cross-sectional view, respectively, of a component such as the one disclosed in European patent 0,600,810.
Figure 1B:
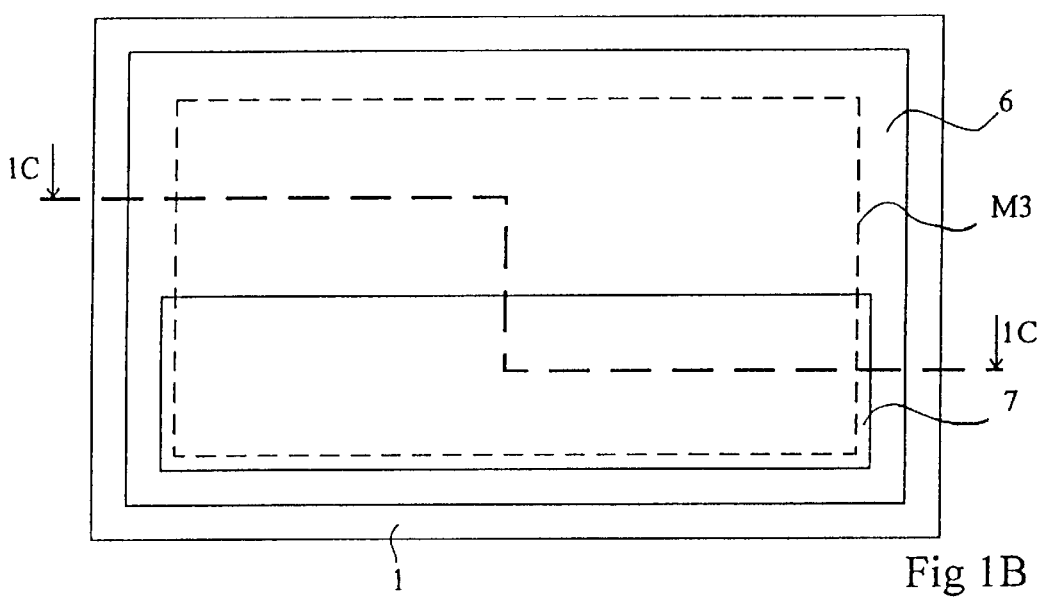
Figure 1C:
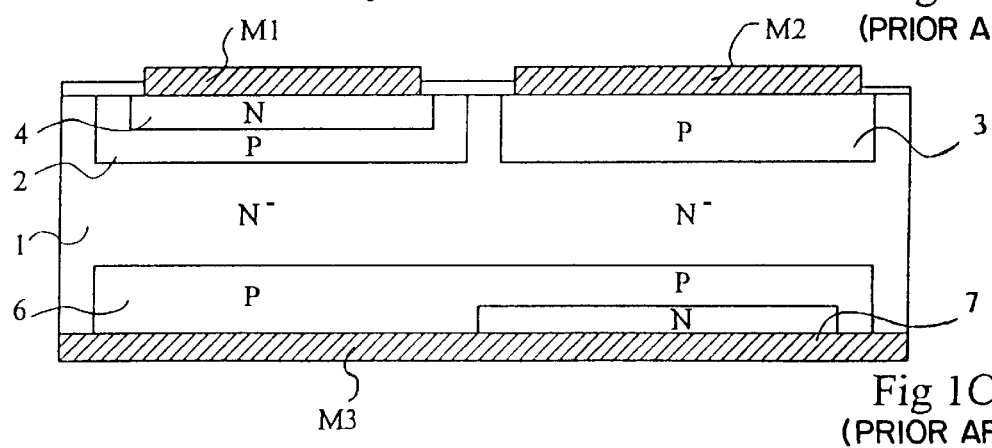
Figure 6A:
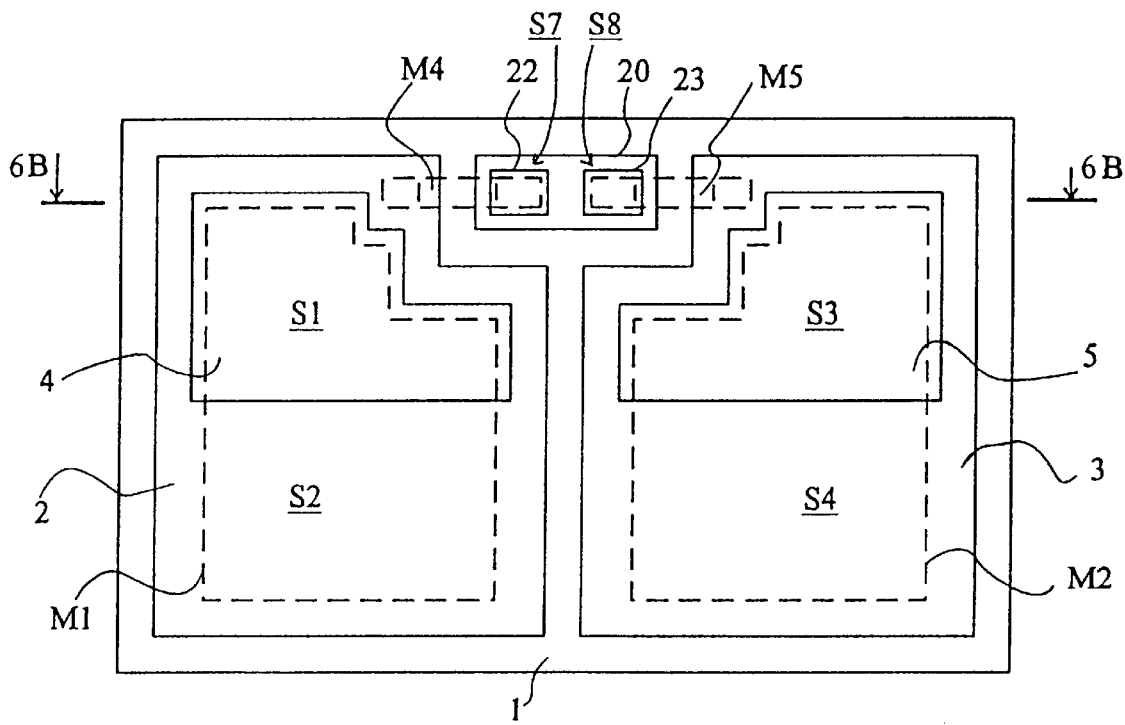
FIGS. 6A and 6B are a top view and a cross-sectional view along line B—B, respectively, of a component according to the present invention.
Figure 6B:
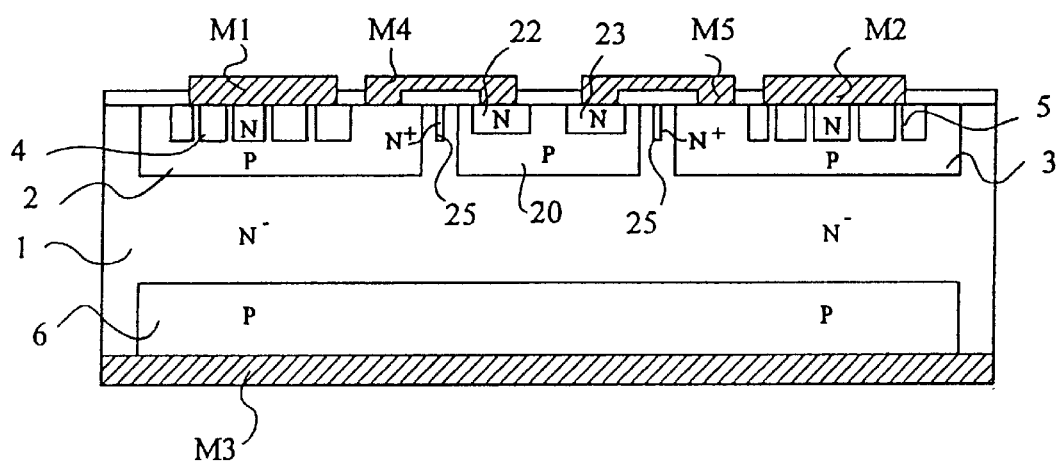

FIGS. 6A and 6B are a top view and a cross-sectional view, respectively, along line B—B of a component modified according to the present invention with respect to the component of FIG. 1. In these figures, the same references designate portions similar to those of FIG. 1. FIGS. 6A and 6B show again substrate 1, wells 2, 3, and 6 and regions 4 and 5, as well as metallizations M1, M2, and M3. Region 7 is not shown in these drawings but it should be noted that the bottom view of the component of FIG. 6A is identical to the bottom view represented in FIG. 1B.

The present invention modifies the above disclosed component by adding a preferential triggering region to the Shockley diodes D1 and D3, that is, to the Shockley diodes corresponding to the layers and regions 4, 2, 1, 6 and 5, 3, 1, 6, respectively. An embodiment of this preferential triggering region is represented in the upper part of FIG. 6A and in the center of FIG. 6B. This preferential triggering region includes a small-size P-type well 20 disposed between wells 2 and 3, near regions 4 and 5 of wells 2 and 3. Two N-type regions 22 and 23 are formed inside well 20 and are respectively connected to wells 2 and 3 through metallizations M4 and M5. Well 20 is designed so that, when a negative overvoltage occurs on metallizations M1 and M2, the blocking junction between well 20 and substrate 1 avalanches before the blocking junctions between each well 2 and 3 and substrate 1. The Shockley diodes S1 and S3 then behave as thyristors whose respective P-regions 2 and 3 constitute gate regions supplied by the conduction of the respective auxiliary Shockley diodes S7 and S8 corresponding to regions 6-1-20-22 and 6-1-20-23. In other words, the Shockley diodes S1 and S3 behave as amplifying gate thyristors that break over very rapidly as soon as they receive a gate current.

Those skilled in the art know various ways to increase the sensitivity of the auxiliary Shockley diodes S7 and S8 with respect to the main Shockley diodes Si and S3.

In the exemplary device illustrated in FIGS. 6A and 6B, this increase in sensitivity is due to the fact that regions 22 and 23 do not include emitter shorts whereas regions 4 and 5 include emitter shorts (not shown). Since regions 22 and 23 do not include emitter shorts, the auxiliary Shockley diodes have a lower hold current than the main Shockley diodes S1 and S3. However, this is not a drawback since, as soon as the main Shockley diodes S1 and S3 are conductive, the auxiliary Shockley diodes S7 and S8 are automatically turned off. In addition, the conduction of the two auxiliary Shockley diodes occurs practically simultaneously since their blocking junctions correspond to the same junction between well 20 and substrate 1. This practically simultaneous conduction causes, in response to an amplification effect, a practically simultaneous conduction of the main Shockley diodes S1 and S3.

FIG. 6B also represents an $N^+$ region 25 at the periphery of well 20. The $N^+$ region 25 has a conventional stop-channel function and is designed to increase the voltage applicable to the system.

Figure 7A:
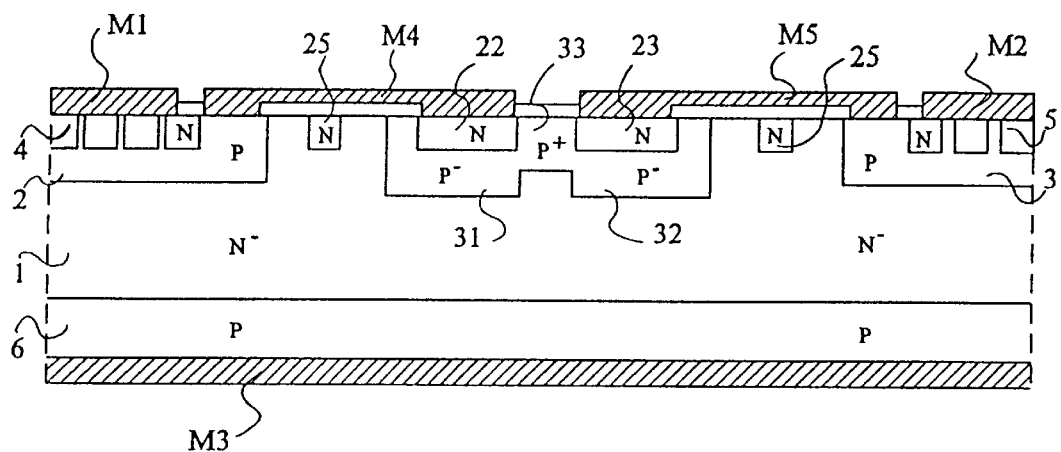
FIGS. 7A, 7B, and 8–11 are cross-sectional views of various alternative embodiments of a component according to the present invention.
Figure 7B:
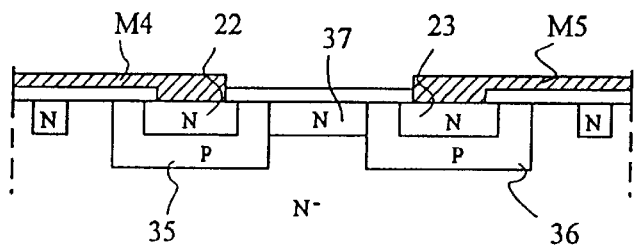

FIGS. 7A and 7B represent alternative embodiments of the preferential triggering area. In the embodiment of FIG. 7A, emitter short regions are represented in N-type regions 4 and 5. As indicated above, it should be clear that such emitter shorts are present in the N-type regions 4 and 5 illustrated in all the figures of the present invention. Moreover, in FIG. 7A, well 20 is partitioned into two sub-wells 31 and 32 in which regions 22 and 23, respectively, are formed. The two sub-wells 31 and 32 are separated by a highly ($P^{30}$) doped P-type region 33, having a higher doping level than that of wells 2 and 3. In addition, the two sub-wells 31 and 32 are preferably less doped than wells 2 and 3. Thus, triggering will preferably occur at the $NP^+$junction between the substrate 1 and region 33. The low doping level of regions 31 and 32 causes the gain of the NPN transistors 22-31-1 and 23-32-1, involved in the triggering of the Shockley diode, to increase.

In the variant of FIG. 7B, well 20 is also partitioned into two sub-wells 35 and 36. The two sub-wells 35 and 36 are separated by an N-type region 37, whose doping level is at least as high as that of the various N-type regions 4, 5, 22, 23. In this case, the triggering will occur at the PN junctions 35-37 or 36-37 that break down before junctions 2-1 and 3-1, since region 37 is more highly doped than substrate 1.

Figure 2:
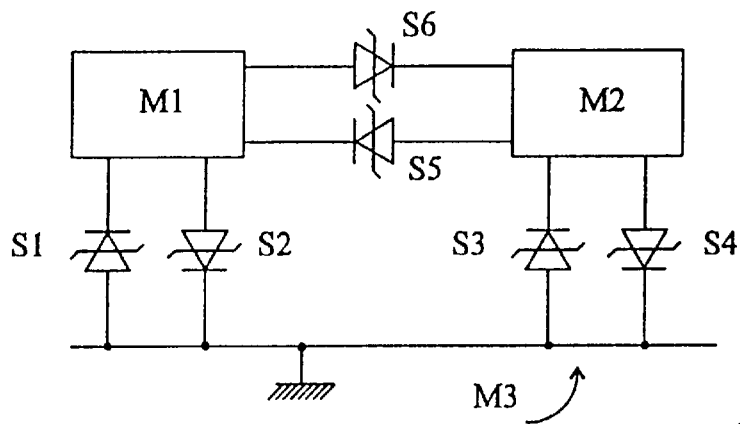
FIGS. 2 and 3 are equivalent circuits of the component of FIG. 1.
Figure 3:
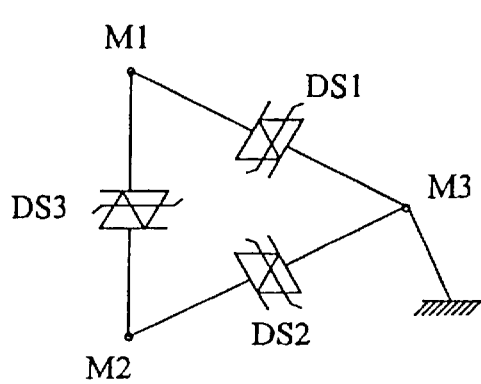
Figure 4:
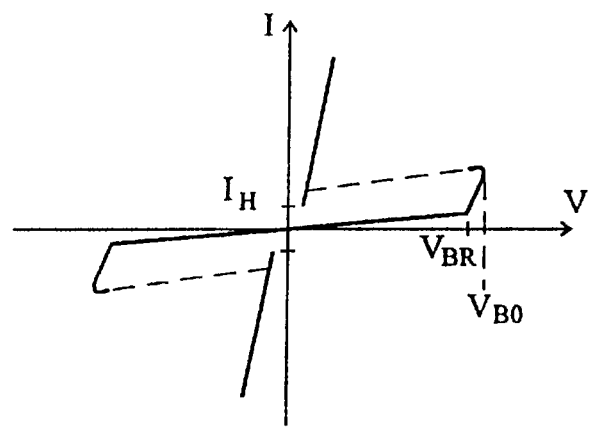
FIG. 4 represents the current-voltage curve of a bidirectional Shockley diode.
Figure 5:
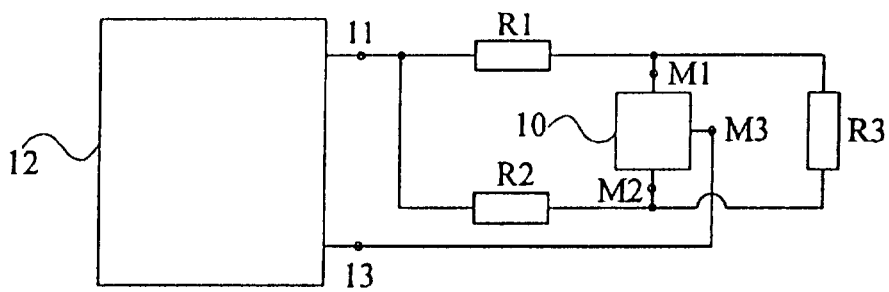
FIG. 5 illustrates a method for testing a protection component.

Thus the component represented in FIGS. 6A and 6B, or its variants illustrated in FIGS. 7A and 7B, satisfy the desired function, that is, simultaneously triggering the two bidirectional Shockley diodes connected between two lines and ground regardless of the polarity of an overvoltage simultaneously occurring on the two lines. However, such structures may impair the operation of the device when an overvoltage occurs on only one line with respect to ground. In this case, it is desired that the bidirectional Shockley diode DS1 or DS2 (refer to FIG. 3) between this line and the ground operates before (or, at least, not after) the bidirectional Shockley diode DS3 between the two lines. This means, referring to FIG. 2, that the avalanche voltages of the Shockley diodes S5 and S6 must be at least equal to the avalanche voltages of the Shockley diodes S1–S4. This was obtained with the structure of FIG. 1 where the blocking junctions of the Shockley diodes S5 and S6 correspond to the junction between either one of wells 2 and 3 and substrate 1. In contrast, according to the invention, due to the presence of metallizations M4 and M5, this blocking junction becomes the junction between region 22 or 23 and well 20 or the corresponding sub-wells.

Figure 8:
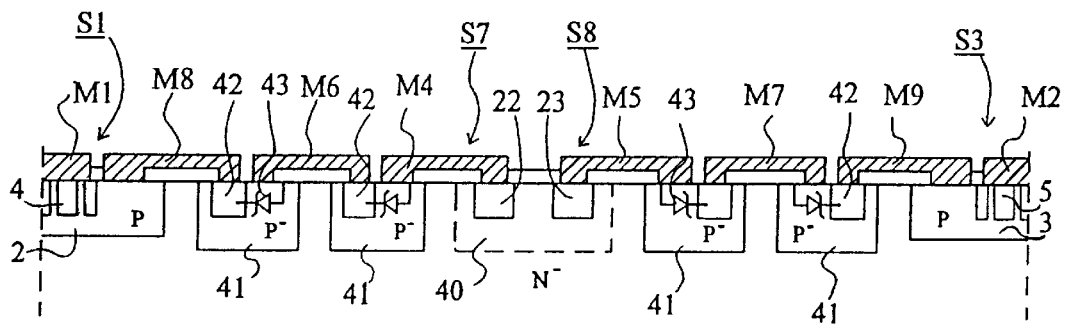

To avoid this drawback, the structure can be modified as illustrated in FIG. 8, which is a partial view of the preferential triggering area according to the invention. The right and left portions of FIG. 8 show wells 2 and 3 and regions 4 and 5 which are diffused in the wells and coated with metallizations M1 and M2. FIG. 8 also shows N-type regions 22 and 23 that are diffused in a region drawn in dotted lines and referenced 40 which corresponds to one of the embodiments described above with relation to FIGS. 6 and 7. However, regions 22 and 23 are not directly connected to wells 2 and 3 but are connected to the latter through intermediate P-type wells 41 in which N-type regions 42 are diffused. The N-type region 22 is respectively connected to well 2 through a first metallization M4 connected to a first well 41, then to a second metallization M6 between a first region 42 and the next well 41, and so on (metallization M8). Similarly, region 23 is connected to well 3 through successive metallizations M5, M7, and M9. Preferably, wells 41 have a lower doping level than wells 2 and 3. This amounts to connecting each well 2 and 3 to regions 22 and 23 through zener diodes 43 that enhance the breakdown voltage of the device.

Figure 9:
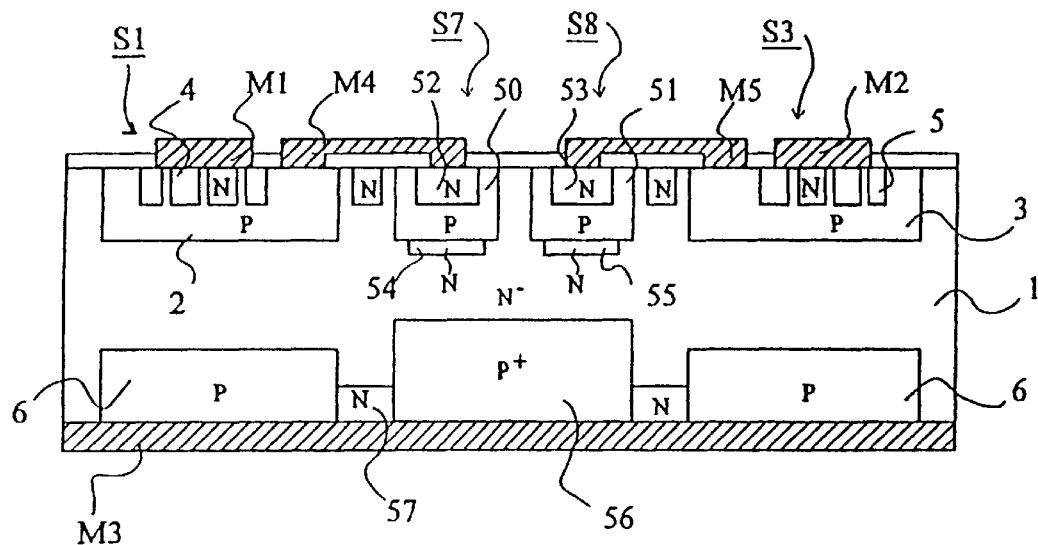

FIG. 9 represents another alternative embodiment of the present invention. Instead of a single well 20 the preferential triggering region includes two P-type wells in which are disposed respective N-type regions 52 and 53 that are connected through metallizations M4 and M5 to P-wells 2 and 3. Since wells 50 and 51 are very close to each other, the triggering of the junction between one of wells 50 or 51 and the substrate generates charges that immediately cause the triggering of the corresponding junction of the adjacent well. This structure solves the above problem relative to the breakdown voltage of the Shockley diodes S5 and S6.

FIG. 9 illustrates other variants of the present invention which could also be used in the embodiment of FIG. 6A. More particularly, in FIG. 9, N-type regions 54 and 55, more highly doped than the substrate, are provided beneath wells 50 and 51, respectively. Another way to enhance the preferential triggering is to use simultaneously or separately, on the lower side of the substrate, a deeper P-type area 56 having an higher doping level than the P-type region 6 extending over the whole lower surface of the substrate. This causes a decrease in the base width and an increase in the gain of the PNP transistors 56-1-50 and 56-1-51 that cooperate to the triggering of the auxiliary Shockley diodes. Area 56 can be separated from region 6 by an N-type ring 57.

Figure 10:
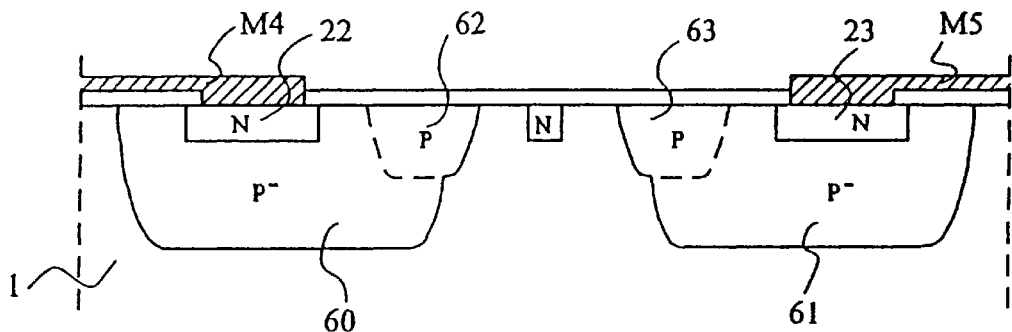

FIG. 10 represents a further alternative embodiment of the present invention that can be compared with the embodiment of FIG. 7A or FIG. 9. Regions 22 and 23 are also diffused in distinct wells 60 and 61 that have a lower doping level than wells 2 and 3. Respective diffused regions 62 and 63 resulting from the same diffusion as that of wells 2 and 3 are formed in the areas facing wells 60 and 61. In this case, the preferential triggering is caused, as indicated above, by the fact that in regions 22 and 23 there are no emitter shorting holes and that regions 60 and 61 have a lower doping level, which causes an increase in the gain of the NPN transistors 22-60-1 and 23-61-1. Due to the fact that regions 62 and 63 are close to each other and face each other, the triggering of one region causes the immediate triggering of the other in response to a charge injection.

Figure 11:
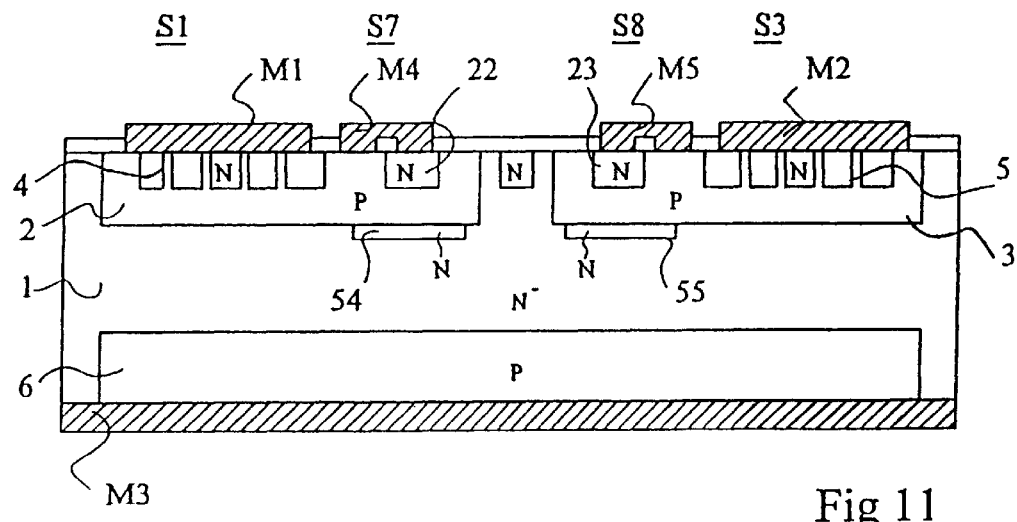

FIG. 11 represents still another alternative embodiment of the present invention in which the N-type regions 22 and 23 are not formed in separate wells but in facing regions of wells 2 and 3. The preferential triggering will occur due to the presence of N-type layers 54 and 55, that are more highly doped than the substrate. Layers 54 and 55 are disposed at the interface between wells 2 and 3 and the substrate beneath regions 22 and 23. The preferential triggering also results from the fact that regions 22 and 23, unlike regions 4 and 5, do not include emitter shorts. Here again, the triggering of one of the auxiliary Shockley diodes 6-1-54-2-22 or 6-1-55-3-23 causes the triggering of the other Shockley diodes due to the fact that they are close together and due to the resulting charge diffusion.

As is apparent to those skilled in the art of the protection components and thyristors, although the present invention has been described with reference to specific embodiments, various modifications can be made to the above disclosed preferred embodiments, in particular, as regards the insulation means and the periphery of the components that have not be described in detail. For example, the components can be of the mesa-type rather than planar, well-type, etc. In addition, the various alternative embodiments of the protection component according to the invention can be combined together and combined with the alternative embodiments described in the above cited patent application.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A protection semiconductor component including at least two pairs of main Shockley diodes, each pair including two parallel diodes, head-to-tail connected between a front surface metallization and a rear surface metallization, the rear surface metallization being common to the two pairs of diodes, wherein each of the main diodes has blocking junction that corresponds to a distinct well on the side of the front surface and is associated with at least one auxiliary Shockley diode, formed in a well distinct from the well of the main Shockley diodes, having the same polarity and a lower triggering threshold that the triggering of one auxiliary diode causes the triggering of the other auxiliary diode and of the associated main Shockley diodes.

2. An overvoltage protection semiconductor component including:

a substrate region of a first conductivity type having upper surface and a lower surface;

a second and a third region of a second conductivity type, on the upper surface, each region occupying approximately one half of the upper surface of the substrate region;

a fourth and a fifth region of the first conductivity type, including shorting holes, in each second and third region, each occupying substantially one half of a surface the second and third region respectively;

a sixth region of the second conductivity type on the lower surface, occupying substantially the whole lower surface of the substrate region;

a seventh region of the first conductivity type, that provided with shorting holes and formed in the sixth regions and that substantially complements, in projection the fourth and fifth regions;

a first contact connected to the second and fourth regions;

a second contact connected to the third and fifth regions;

a third contact connected to the sixth and seventh regions;

wherein a first and second parallel, head-to-tail, Shockley diodes are formed between the first and third contacts, and third and fourth parallel, head-to-tail, Shockley diodes are formed between the second and third contacts, the first Shockley diode corresponding to the fourth, second, substrate and sixth regions, the third Shockley diode corresponding to the fifth, third, substrate and sixth regions; and an eighth region of the second conductivity type adjacent to the second and third regions, and ninth and tenth regions of the first conductivity type, without shorting holes, that are disposed in the eighth region, the ninth and tenth regions being connected to the second and third regions, respectively.

3. The component of claim 2, further including eleventh regions of the second conductivity type formed in the upper surface of the substrate region, and twelfth regions of the first conductivity type formed in the eleventh regions, the connection between each ninth and tenth regions and between the second and third regions, respectively being made through intermediate contacts connecting each of the ninth, tenth and twelfth regions to the eleventh adjacent region.

4. The component of claim 2, further including a thirteenth region of the first conductivity type, more highly doped than the substrate region disposed at the interface between the eighth region and the substrate region.

5. The semiconductor component of claim 2, wherein the eighth region is partitioned into two sub-regions, having a lower doping level than the second and third regions, separated by a separation region of the second conductivity type more highly doped than the second and third regions.

6. The semiconductor component of claim 2, wherein the eighth region is partitioned into two sub-regions, having a lower doping level than the second and third regions, separated by a separation region of the first conductivity type, more highly doped than the substrate region.

7. The semiconductor component of claim 2, wherein the eighth region is partitioned into two sub-regions, having a lower doping level than the second and third regions, the two sub-regions having facing regions of the second conductivity type, having the same doping level as the second and third regions.

8. The semiconductor component of claim 2, wherein the sixth region includes, facing the preferential triggering region, a deeper region having a higher doping level.

9. The semiconductor component of claim 2, wherein the ninth and tenth regions are disposed in regions facing the second and third regions, respectively, and wherein the preferential triggering structure further includes fourteenth regions of the first type of conductivity, having a higher doping level than the substrate region, said fourteenth regions being disposed at the interface between the second and third regions and the substrate region, beneath the ninth and tenth regions.

10. The semiconductor component of claim 2, wherein the preferential triggering structure includes:

a first extended region of the second conductivity type formed in a portion of said second region facing said third region; and a second extended region of the second conductivity type formed in a portion of said third region facing said second region.

11. The semiconductor component of claim 10, wherein the preferential triggering structure further includes:

a separating region of the first conductivity type formed in the upper surface of said substrate region between said first and second extended regions, said separating region having a higher doping level than said substrate region.

12. The semiconductor component of claim 11, wherein said preferential triggering structure further includes:

a ninth region of the first conductivity type formed in said first extended region, said ninth region being connected to said second region; and a tenth region of the first conductivity type formed in said second extended region, said tenth region being connected to said third region.

13. The semiconductor component of claim 12, wherein said preferential triggering structure further includes:

two fourteenth regions of the first conductivity type and having a higher doping level than said substrate region, said fourteenth regions being formed at the interface of said second and third regions and said substrate regions, and being disposed beneath said ninth and tenth regions.

14. The semiconductor component of claim 10, wherein said first and second extended regions have a higher doping level than said second and third regions.

15. The semiconductor component of claim 14, wherein the preferential triggering structure further includes:

a separating region of the first conductivity type formed in the upper surface of said substrate region between said first and second extended regions, said separating region having a higher doping level than said substrate region.

16. A overvoltage protection semiconductor component comprising:

a first pair of parallel, head-to-tail, Shockley diodes between a first contact and a second contact, including a first triggered Shockley diode;

a second pair of parallel, head-to-tail, Shockley diodes between a third contact and said second contact, including a second triggered Shockley diode; and a triggering structure formed distinctly from said first and second pairs of Shockley diodes for preferentially triggering said first and second triggered Shockley diodes such that said first and second triggered Shockley diodes are triggered substantially simultaneously.

17. The semiconductor component according to claim 16, wherein said triggering means includes a first auxiliary Shockley diode connected to said first triggered Shockley diode;

a second auxiliary Shockley diode connected to said second triggered Shockley diode;

wherein said first and second auxiliary Shockley diodes have the same polarity as and lower triggering threshold than said first and second triggered Shockley diodes.

18. The semiconductor component according to claim 17, further comprising inhibiting means for inhibiting triggering of one of said first and second triggered Shockley diodes when an overvoltage occurs on only one of said first and second contacts.

19. The semiconductor component according to claim 18, wherein said inhibiting means includes:

a first zener diode connected between said first auxiliary Shockley diode and said first triggered Shockley diode, and a second zener diode connected between said second auxiliary Shockley diode and said second triggered Shockley diode.

* * * * *